United States Patent
Arai et al.

(10) Patent No.: US 7,030,800 B2
(45) Date of Patent: Apr. 18, 2006

(54) ANALOG-TO-DIGITAL CONVERSION APPARATUS AND METHOD

(75) Inventors: Michiaki Arai, Gunma (JP); Masanobu Nishi, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/502,897

(22) PCT Filed: Jan. 30, 2003

(86) PCT No.: PCT/JP03/00875

§ 371 (c)(1),
(2), (4) Date: Jul. 27, 2004

(87) PCT Pub. No.: WO03/067764

PCT Pub. Date: Aug. 14, 2003

(65) Prior Publication Data

US 2005/0068211 A1    Mar. 31, 2005

(30) Foreign Application Priority Data

Jan. 30, 2002    (JP) .............................. 2002-021639

(51) Int. Cl.
*H03M 1/12*    (2006.01)
(52) U.S. Cl. ..................................................... 341/155
(58) Field of Classification Search ................ 341/139, 341/155, 132, 172, 110, 143; 375/345; 455/232.1, 455/234.1
See application file for complete search history.

(56) References Cited

U.S. PATENT DOCUMENTS

| | | | | |
|---|---|---|---|---|
| 5,844,512 A | * | 12/1998 | Gorin et al. ................. | 341/139 |
| 6,288,664 B1 | * | 9/2001 | Swanson ..................... | 341/155 |
| 6,836,229 B1 | * | 12/2004 | Gregoire ..................... | 341/139 |

FOREIGN PATENT DOCUMENTS

| | | |
|---|---|---|
| JP | 98771 | 8/1975 |
| JP | 61203719 | 9/1986 |
| JP | 3-32226 | 2/1991 |
| JP | 6-61858 | 3/1994 |
| JP | 7191962 | 7/1995 |
| JP | 7321655 | 12/1995 |
| JP | 10209868 | 8/1998 |

* cited by examiner

*Primary Examiner*—Brian Young
(74) *Attorney, Agent, or Firm*—David N. Lathrop, Esq.; Gallagher & Lathrop

(57) ABSTRACT

A properly level-controlled digital signal can be obtained every sample. An input signal is supplied to amplifiers having their gains of one, two, four and eight. Outputs of the amplifiers are converted to digital signals at the same time in corresponding A/D converters having the same characteristic, respectively, and inputted to a data selection part. In the data selection part, when an input signal is high level, one A/D converter to which is inputted the input signal passing through the corresponding amplifier having its large gain, overflows so that the overflow-bit thereof becomes "1". The output digital signal of the A/D converter is selected and outputted, which is connected to the amplifier having the largest gain among the amplifiers connected to corresponding A/D converters each of which has its overflow-bit is "0". The digital signal is corrected in its scale and outputted.

13 Claims, 14 Drawing Sheets

| GAIN | 1 | 2 | 4 | 8 |
|---|---|---|---|---|
| SELECTION INFORMATION | 00 | 01 | 10 | 11 |

FIG. 6

| SELECTION INPUT OUTPUT | 00 | 01 | 10 | 11 |
|---|---|---|---|---|
| GAIN | 8 | 4 | 2 | 1 |

FIG. 9

ANALOG-TO-DIGITAL CONVERSION APPARATUS AND METHOD

TECHNICAL FIELD

The present invention relates to an analog-to-digital conversion apparatus and an analog-to-digital conversion method for converting an input signal to a digital signal, and more particularly, to analog-to-digital conversion apparatus and method that are capable of converting an input signal the dynamic range in signal level of which is wide and the frequency of which is comparatively high to a digital signal.

BACKGROUND ART

In a spectrum analyzer, network analyzer, or the like, for example, there is carried out such a procedure that an input signal is converted to an intermediate frequency signal the frequency of which is one in the range of, for example, 1 MHz to 21.4 MHz or so and then the intermediate frequency signal is converted to a digital signal. In such case, there is required an analog-to-digital conversion apparatus (hereinafter, referred to as A/D conversion apparatus) for converting an input signal to a digital signal, the A/D conversion apparatus having its dynamic range greater than 100 dB as well as higher or faster sampling rate than 42.8 MSa/s (million samples per second). An A/D conversion apparatus that fulfils such requirements is much costly.

An A/D conversion apparatus in which the above-mentioned problem can be solved has been proposed in U.S. Pat. No. 5,844,512 (issued on Dec. 1, 1998). FIG. 1 is a block diagram showing a simplified construction of an A/D conversion apparatus shown in FIG. 4 of U.S. Pat. No. 5,844,512, and there will be now described an outline of the construction and the operation of this A/D conversion apparatus with reference to FIG. 1.

As shown in FIG. 1, an input signal from an input terminal 11 is supplied to an anti-aliasing filter 12 and an envelope detector 14. An input signal that has passed through the anti-aliasing filter 12 is supplied to a variable gain amplifier 13. On the other hand, an input signal inputted to the envelope detector 14 is detected in its envelope by the detector 14, and the detected output is inputted to a gain controller 15 as a proposed gain. The gain controller 15 refers to an output level of the envelope detector 14 and a gain set in the variable gain amplifier 13 to alter and set the gain of the variable gain amplifier 13 so that the output level of the variable gain amplifier 13 comes within a predetermined range. Further, the envelope detector 14 corresponds to the proposed gain detector 48 shown in FIG. 4 of U.S. Pat. No. 5,844,512, and also the gain controller 15 corresponds to the gain setting rule processor 50 shown in FIG. 4 of U.S. Pat. No. 5,844,512.

In such manner as stated above, an input signal is amplified in the variable gain amplifier 13 to a signal the level of which comes within the predetermined range, and the amplified signal is supplied to a sample-and-hold circuit 16. In the sample-and-hold circuit 16, an output signal from the variable gain amplifier 13 is sampled by a sampling clock $CK_S$ and the sampled value or data is held therein. The sampled value held in the sample-and-hold circuit 16 is converted by an analog-to-digital converter (hereinafter, referred to as A/D converter) 17 to a digital signal (digital value) which is, in turn, supplied to a correction processing part 18. The correction processing part 18 corrects an inputted digital signal by referring to a look-up table 19 in accordance with an output signal from the gain controller 15. For example, the correction processing part 18 will correct an error in a digital signal that is caused by a shift in the input-output characteristic of the variable gain amplifier 13 from an ideal characteristic thereof, and further, will correct an inputted digital signal to a digital signal showing a level of the input signal before it is amplified by the variable gain amplifier 13 depending upon a gain set to the variable gain amplifier 13. The corrected digital signal is outputted to an output terminal 21 of the correction processing part 18. Further, the correction processing part 18 corresponds to the scaling processor 64 shown in FIG. 4 of the above-stated U.S. Pat. No. 5,844,512.

In the prior art A/D conversion apparatus shown in FIG. 1, the level of an input signal is detected by the envelope detector 14 and the gain of the variable gain amplifier 13 is set depending upon the detected level. Since the envelope detector 14 has a time constant so that a time delay or lag occurs, in the prior art, the anti-aliasing filter 12 is inserted before the variable gain amplifier 13 to remove any aliasing as well as an input signal is delayed by delay means to match a timing when the signal is inputted to the variable gain amplifier 13 to a timing when the detected level of the input signal is inputted to the gain controller 15 so that the level of the input signal can be controlled by the variable gain amplifier 13. However, an input signal undergoes a distortion by the anti-aliasing filter 12 or a delay line unless the group delay thereof is constant and also the frequency characteristic in the amplitude is constant so that it is difficult to convert an input signal to a digital signal with high accuracy.

In addition, since an input signal is detected in its envelope so that the level thereof is detected, as shown in FIG. 2A, for example, when an input signal shown by a solid line 22 is supplied, the gain is set to eight times at the level L1, four times at the level L2, twice at the level L3, and one at the level L4 as shown a broken line 23, and the gain is changed every plural samples. An example of a sample point 24 is illustrated in FIG. 2A by a black point or dot. For this reason, in case of inputting a signal obtained by sweeping or varying the frequency of an input signal; converting the signal to a digital signal; multiplying the digital signal by a digital sine wave signal and a digital cosine wave signal; obtaining the sum of squares of these multiplied values; and finding the frequency characteristic in the amplitude of the input signal, there is obtained, for instance, a waveform the level of which varies stepwise at points 25 where the gain of the variable gain amplifier 13 is changed, that is, a discontinuous waveform as shown in FIG. 2B, and hence a correct display of waveform cannot be obtained.

Moreover, when the gain of the variable gain amplifier 13 is changed, a whisker-like noise (impulse-like noise) or noises are generated in the amplified output signal. If this noise portion should be sampled in the sample-and-hold circuit 16, the noise is sampled so that a false digital signal is outputted.

DISCLOSURE OF THE INVENTION

An object of the present invention is to provide an A/D conversion apparatus that is able to solve the above-stated prior art problems.

Another object of the present invention is to provide an analog-to-digital conversion method by which the above-stated prior art problems can be solved.

In order to attain the foregoing objects, in an aspect of the present invention, there is provided an analog-to-digital conversion apparatus comprising: at least one level controller that controls the level of an input signal; at least one analog-to-digital converter; and selection means that outputs, depending upon the magnitude of the level of an input signal, a digital signal obtained by digital-converting the input signal or obtained by digital-converting the input signal after the level of the input signal is controlled.

In accordance with one mode of the present invention, there are provided, as the analog-to-digital converter, an analog-to-digital converter for converting an input signal the level of which is not controlled to a digital signal and at least one analog-to-digital converter for converting a signal the level of which is controlled by corresponding level controller to a digital signal, and the selection means selects and outputs one of the digital signals converted respectively by the plural analog-to-digital converters depending upon the digital signals.

The aforesaid selection means may be means that selects, in case the plural analog-to-digital converters are ranked in order of the magnitudes of the levels of input signals inputted thereto, the output digital signal of the analog-to-digital converter the overflow-bit of which is "0" and the rank of which is immediately lower than that of the analog-to-digital converter the overflow-bit of the output digital signal of which is "1", or alternatively, the selection means may comprise: a plurality of comparators each comparing the digital signal of each analog-to-digital converter with a reference value; and means that selects, in case the plural analog-to-digital converters are ranked in order of the magnitudes of the levels of input signals inputted thereto, the output digital signal of the analog-to-digital converter corresponding to one of the comparators the output of which is lower than the reference value as well as the rank of which is immediately lower than that of the analog-to-digital converter corresponding to another one of the comparators the output of which is higher than the reference value.

In accordance with another mode of the present invention, there are provided as the analog-to-digital converter a first analog-to-digital converter for converting the input signal the level of which is not controlled to a digital signal and a second analog-to-digital converter for converting a signal the level of which is controlled by the corresponding level controller to a digital signal, and the selection means is means that selects and outputs at once the digital signal outputted from the first analog-to-digital converter when the overflow-bit of the digital signal outputted from the second analog-to-digital converter for converting a signal the level of which is controlled to a digital signal, changes from "0" to "1" and that remains the selection of the digital signal outputted from the first analog-to-digital converter in case even the overflow-bit of the digital signal outputted from the second analog-to-digital converter changes from "1" to "0" if the state of "0" changes to "1" within a preset time.

In accordance with still another mode of the present invention, there is provided as the analog-to-digital converter one main analog-to-digital converter, and the selection means comprises: a range selection analog-to-digital converter the resolution of which is lower than that of the main analog-to-digital converter and to which the input signal is inputted; and a selection switch part for supplying to the main analog-to-digital converter an output signal from one level controller or the input signal the level of which is not controlled, depending upon a digital signal converted by the range selection analog-to-digital converter.

As the level controller, there may be used a level controller the gain of which is fixed or a level controller the gain of which is previously settable.

In another aspect of the present invention, there is provided an analog-to-digital conversion method comprising the steps of: converting to a digital signal an input signal the level of which is lower after it is controlled in its level, or an input signal the level of which is higher without controlling its level or after it is controlled in its level; and selecting a digital signal based on the input signal the level of which is higher when the overflow-bit of a digital signal based on the input signal the level of which is lower is "1", and selecting a digital signal based on the input signal the level of which is lower when the overflow-bit of a digital signal based on the input signal the level of which is lower is "0".

In accordance with one preferred mode of the present invention, the selecting step further includes the step of selecting, when the overflow-bit of a digital signal based on the input signal the level of which is lower changes from "0" to "1", a digital signal based on the input signal the level of which is higher at once, and remaining the selection of a digital signal based on the input signal the level of which is higher, in case even the overflow-bit of a digital signal based on the input signal the level of which is lower changes from "1" to "0" if the state of "0" changes to "1" within a preset time.

According to the present invention, for each sample of an input signal, a level range suitable for the input signal is determined, and the input signal is converted to a digital signal after it is controlled in its level in accordance therewith or without controlling its level. Therefore, there is no need to use any envelope detector and any gain controller like the prior art, and so any input signal can be converted to a digital signal with high precision. In addition, every plural samples, the gain of the amplifier is not controlled like the prior art, but an input signal is amplified by each amplifier and converted to a digital signal, and this converted digital signal is selected. As a result, a higher accurate digital signal is obtained, and yet, there is no possibility that any whisker-like or impulse-like noise is generated due to control of the gain.

BRIEF DESCRIPTION OF THE DRAWINGS

FIG. 6 is an illustration showing one example of the selected information in the data selection part.

FIG. 9 is an illustration showing a relationship between an output from the range selection A/D converter and the gain of an amplifier to be selected in the A/D conversion apparatus shown in FIG. 8.

BEST MODE FOR CARRYING OUT THE INVENTION

The preferred embodiments of the present invention will now be described in detail with reference to the accompanying drawings. The present invention may, however, be embodied in many different forms and should not be construed as limited to the embodiments set forth hereinafter; rather, the embodiments are provided so that this disclosure will be thorough and complete, and will fully convey the scope of the invention to those skilled in the art.

At first, a first embodiment of the A/D conversion apparatus according to the present invention will be described in detail with reference to FIGS. 3 to 7.

Figure 3:
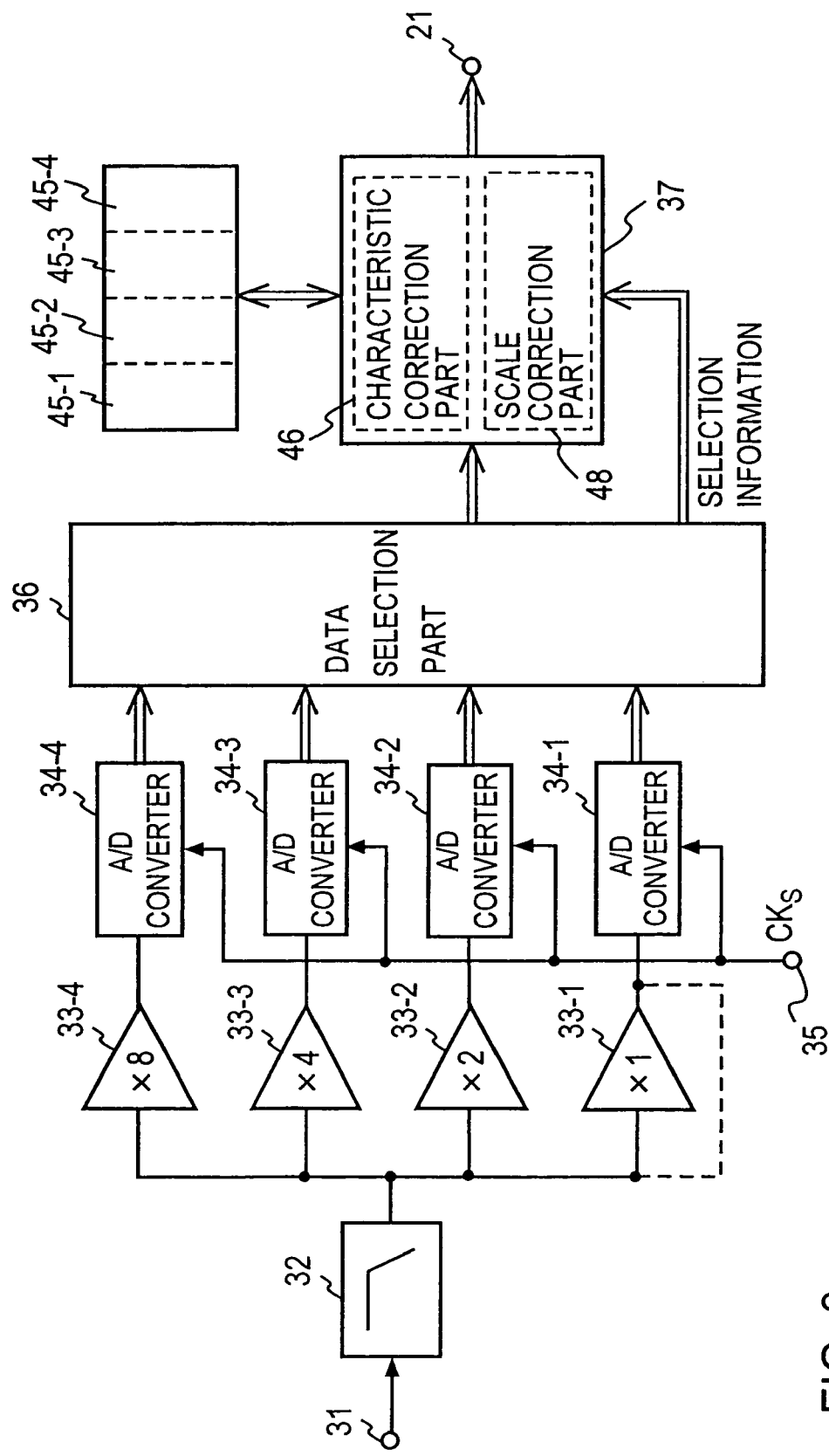
FIG. 3 is a block diagram showing a first embodiment of the A/D conversion apparatus according to the present invention.

FIG. 3 is a block diagram showing the first embodiment of the A/D conversion apparatus according to the present invention. An input signal from an input terminal 31 is supplied, after it has passed through an anti-aliasing filter 32, to four amplifiers (or four level controllers that differ in their control variables from one another) 33-1 to 33-4 that differ in their gains from one another, in this first embodiment. The gains of the four amplifiers 33-1 to 33-4 are fixed, and the gain of the first amplifier 33-1 is set to one (1), the gain of the second amplifier 33-2 is set to two (2), the gain of the third amplifier 33-3 is set to four (4), and the gain of the fourth amplifier 33-4 is set to eight (8). These gains are merely by way of example, and they may be set to other values or may be set to another values except for values of the power of 2 as in the above example.

Figure 1:
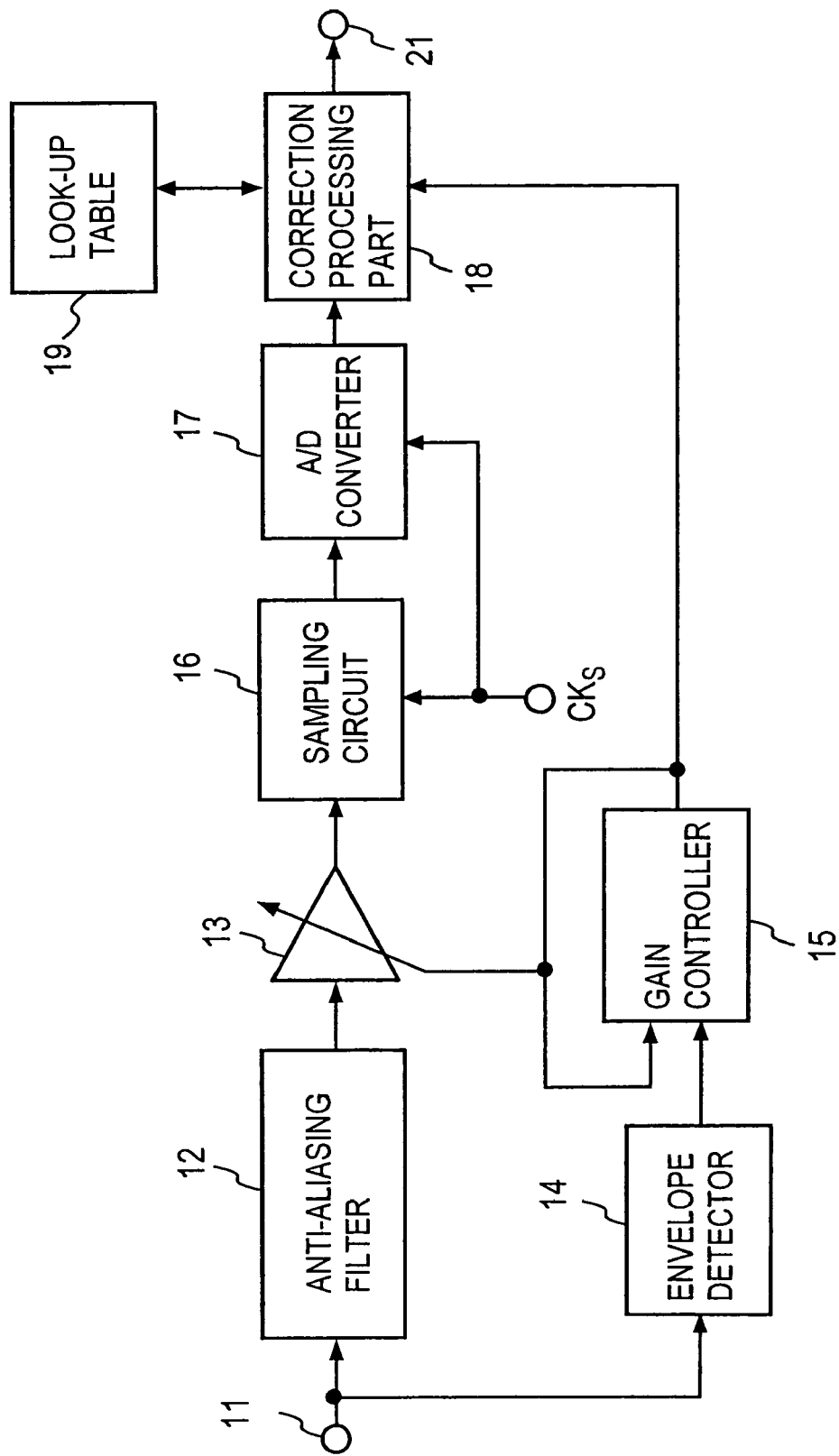
FIG. 1 is a block diagram showing a prior art A/D conversion apparatus.

Outputs from the four amplifiers 33-1 to 33-4 are supplied to corresponding A/D converters 34-1 to 34-4, respectively. These A/D converters 34-1 to 34-4 have the same characteristic, that is, they are configured such that the convertible range in level of each of the A/D converters 34-1 to 34-4 is the same as well as they have the same resolution, and they are operated by the same clock $CK_S$ supplied from a clock terminal 35 thereby to convert outputs from the corresponding amplifiers 33-1 to 33-4 to digital signals with required resolutions within their convertible level ranges. In addition, though not shown in the figure, each of the A/D converters 34-1 to 34-4 is provided with the sample-and-hold circuit 16 of the prior art A/D conversion apparatus shown in FIG. 1 built therein. Further, in case the sample-and-hold circuit is not built therein, it is inserted before each of the A/D converters 34-1 to 34-4.

Output digital signals from the A/D converters 34-1 to 34-4 are inputted to a data selection part 36. The data selection part 36 selects a proper digital signal corresponding to the magnitude in level of the input signal from the input terminal 31 and supplies the selected digital signal to a correction processing part 37. In this embodiment, the data selection part 36 utilizes digital signals from the A/D converters 34-1 to 34-4 to select an output digital signal from one of the A/D converters 34-1 to 34-4, the one A/D converter corresponding to the magnitude in level of the input signal. In other words, a pre-estimated fluctuation range in the levels of input signals are divided into plural ranges, four ranges in this example, and the data selection part 36 selects, depending upon to which divided level range the level of an input signal belongs, an output digital signal from the corresponding A/D converter.

As is well known, each of the A/D converters 34-1 to 34-4 overflows when the level of an input signal thereto is beyond the convertible level range thereof so that the overflow-bit of the converted output digital signal becomes "1". That is, each of the A/D converters 34-1 to 34-4 to the input of which is connected the corresponding amplifier that amplifies an input signal from the input terminal 31 too much so that the amplified signal becomes beyond the operation range of the corresponding A/D converter, outputs a digital signal having its overflow-bit of "1". Accordingly, the A/D converters 34-1 to 34-4 are ranked in such manner that the first or highest rank is given to an A/D converter to which an output of the amplifier having the greatest gain is inputted, the second rank is given to an A/D converter to which an output of the amplifier having the second greater gain is inputted, the third rank is given to an A/D converter to which an output of the amplifier having the third greater gain is inputted, ..., the lowest rank is given to an A/D converter to which an output of the amplifier having the lowest gain is inputted. In this example, the first rank is given to the fourth A/D converter 34-4, the second rank is given to the third A/D converter 34-3, and so on. With such arrangement as stated above, if the data selection part 36 searches or checks the A/D converters 34-1 to 34-4 in order of the ranks from the highest rank as to whether there is an A/D converter the output digital signal of which has the overflow-bit of "1", and it selects the first A/D converter the output digital signal of which has no overflow-bit, that is, the first A/D converter the output digital signal of which has the overflow-bit of "0", the output digital signal of the proper or correct A/D converter can be selected.

This searching of presence of the overflow-bit may be equivalent to a reverse searching that the data selection part 36 searches or checks the A/D converters 34-1 to 34-4 in order of the ranks from the lowest rank, that is, from the lowest rank A/D converter having its overflow-bit of "0", as to whether there is an A/D converter the output digital signal of which has the overflow-bit of "1", and it selects an A/D converter immediately lower in rank than the first A/D converter the output digital signal of which has the overflow-bit of "1". In other words, the data selection part selects an output data of an A/D converter to which is connected an amplifier having its gain lower by one rank than an amplifier the gain of which is the lowest among amplifiers each being connected to corresponding A/D converter having its overflow-bit of "1". Speaking the other way round, the data selection part may select an output data of an A/D converter to which is connected an amplifier having its gain that is the greatest among amplifiers each being connected to corresponding A/D converter having its overflow-bit of "0".

Figure 4:
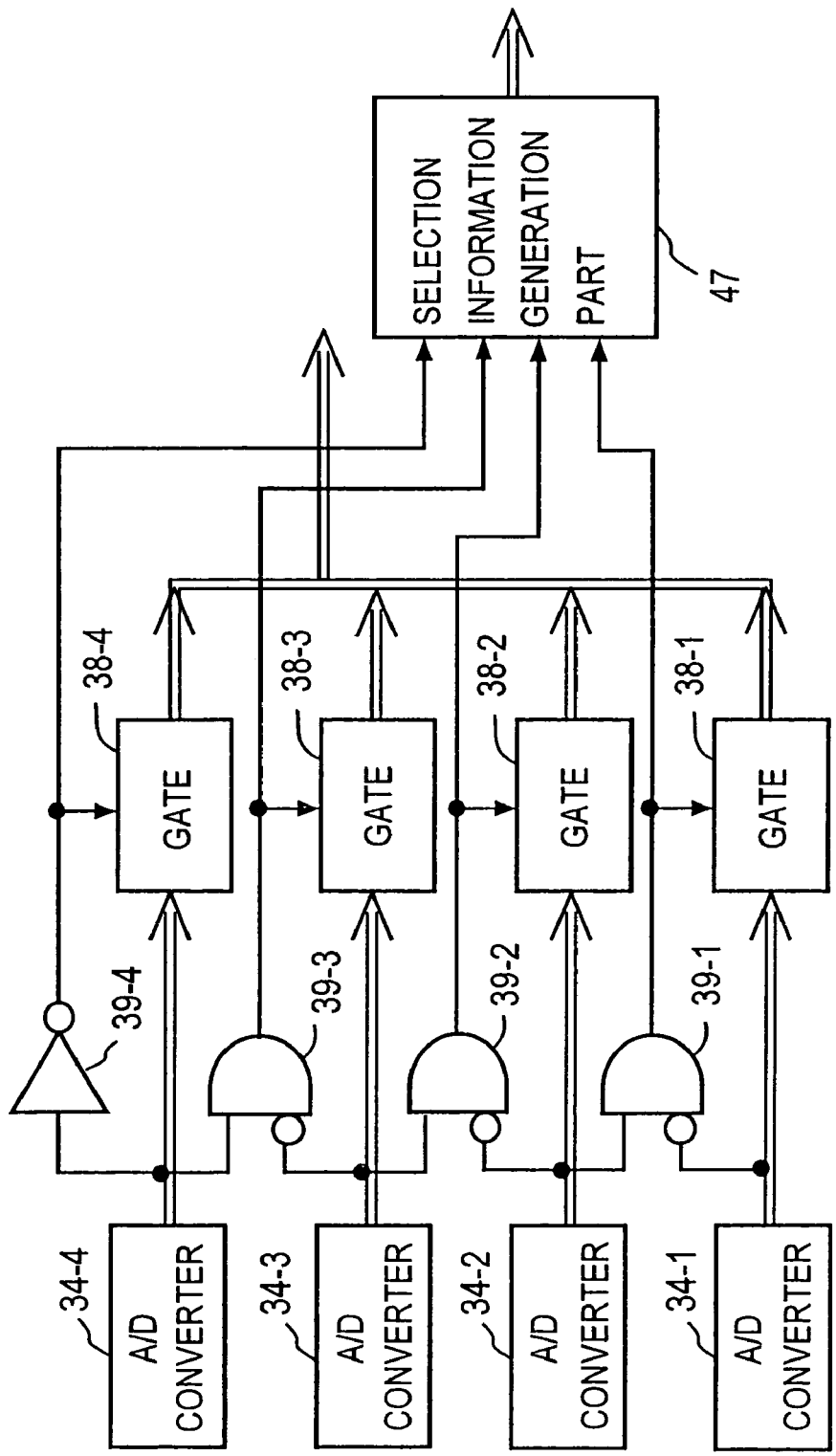
FIG. 4 is a block diagram showing one example of the data selection part in the A/D conversion apparatus shown in FIG. 3.

Selection of a proper A/D converter by utilization of an overflow-bit as discussed above can be carried out by use of the data selection part 36 that is constructed in circuit, for example, as shown in FIG. 4. As shown in FIG. 4, output digital signals of the first to the fourth A/D converters 34-1 to 34-4 are supplied to a first to a fourth corresponding gates 38-1 to 38-4, respectively. The overflow-bit of the fourth A/D converter 34-4 is supplied to the control terminal of the fourth gate through an inverter 39-4 as well as supplied to the non-inverting input terminal of a third AND circuit 39-3 to the inverting input terminal of which is supplied the overflow-bit of the third A/D converter 34-3. In addition, the overflow-bit of the third A/D converter 34-3 is also supplied to the non-inverting input terminal of a second AND circuit 39-2 to the inverting input terminal of which is supplied the overflow-bit of the second A/D converter 34-2. The overflow-bit of the second A/D converter 34-2 is also supplied to the non-inverting input terminal of a first AND circuit 39-1 to the inverting input terminal of which is supplied the overflow-bit of the first A/D converter 34-1. Also, outputs of the first, second and third AND circuits 39-1, 39-2 and 39-3 are supplied to control terminals of the first, second and third gates 38-1, 38-2 and 38-3, respectively.

With the construction as mentioned above, depending upon into which divided range the level of an input signal enters, only an output digital signal of one A/D converter to which is connected an amplifier the gain of which is proper, can pass through one of the four gates 38-1 to 38-4. For example, in case the level of an input signal amplified by the second amplifier 33-2 comes in the proper level range for the second A/D converter 34-2, each of the overflow-bits of the third and fourth A/D converters 34-3 and 34-4 becomes "1" so that the output of the inverter 39-4 and the output of the third AND circuit 39-3 become "0", and so the fourth and third gates 38-4 and 38-3 are not opened. In addition, each of the overflow-bits of the first and second A/D converters 34-1 and 34-2 becomes "0" so that the output of the first AND circuit 39-1 becomes "0", and so the first gate 38-1 is also not opened. However, to the second AND circuit 39-2 are inputted the overflow-bit of "1" from the third A/D converter 34-3 and the overflow-bit of "0" from the second A/D converter 34-2 which is, in turn, inverted to "1". Accordingly, the output of the second AND circuit 39-2 becomes "1" and hence only the second gate 38-2 is opened. As a result, only the output digital signal of the second A/D converter 34-2 can be outputted.

There may be a case that each of the A/D converters has its linearity of conversion that is inferior at portions near the upper and/or lower limit of the convertible level range thereof. Taking such fact into consideration, the output digital signal of the proper A/D converter may be selected by use of the data selection part 36 that is constructed in circuit, for example, as shown in FIG. 5.

Figure 5:
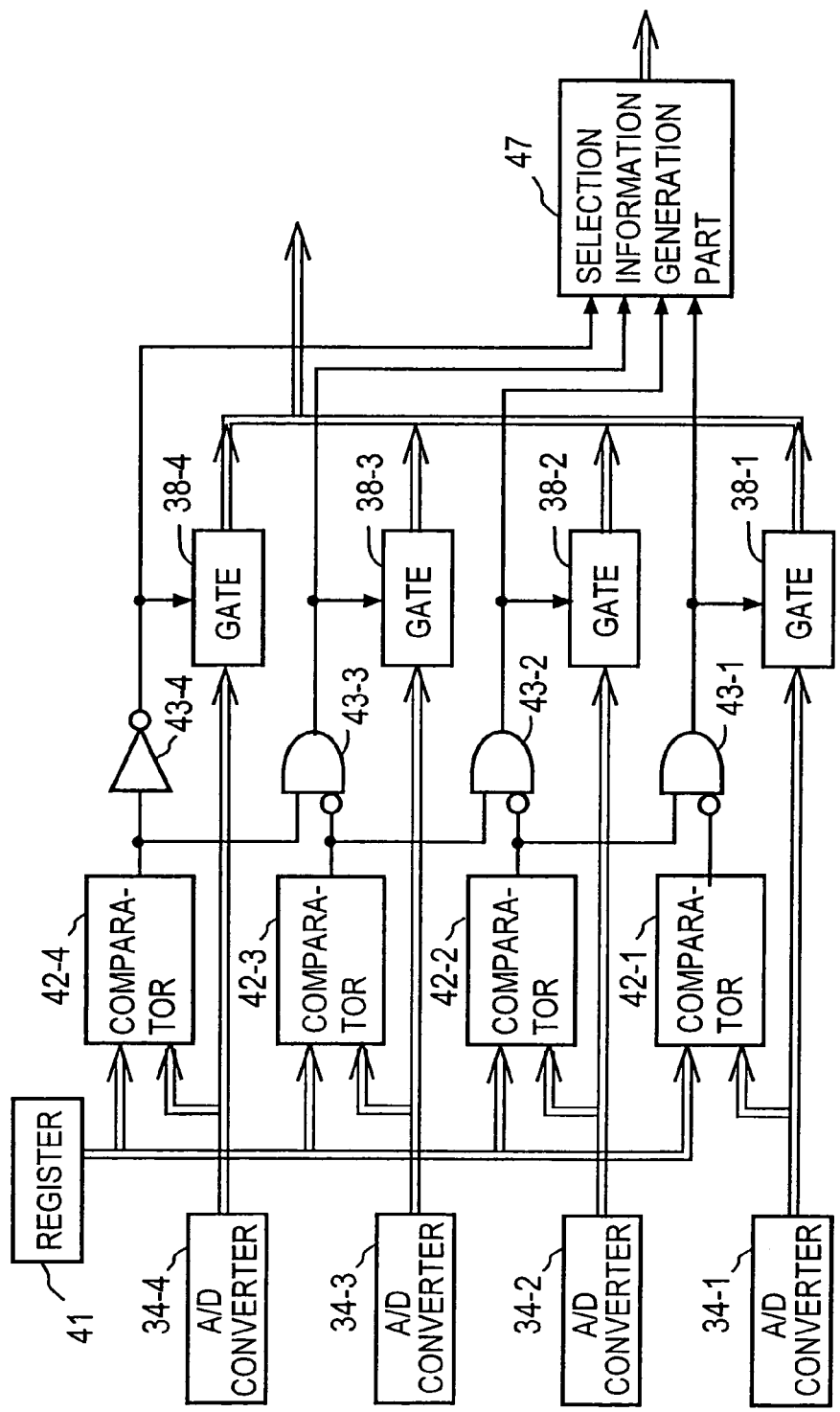
FIG. 5 is a block diagram showing another example of the data selection part in the A/D conversion apparatus shown in FIG. 3.

In the circuit construction shown in FIG. 5, there are provided a register 41 in which reference values are set as well as first to fourth digital comparators 42-1 to 42-4, and each of the reference values set in the register 41 and the output digital signal of corresponding one of the first to fourth A/D converters 34-1 to 34-4 are compared in corresponding one of the digital comparators 42-1 to 42-4. The outputs of the first to third comparators 42-1 to 42-3 are supplied to the inverting input terminals of first to third AND circuits 43-1 to 43-3, respectively, and the outputs of the second to fourth comparators 42-2 to 42-4 are supplied to the non-inverting input terminals of the first to third AND circuits 43-1 to 43-3, respectively. In addition, the output of the fourth comparator 42-4 is supplied to the control terminal of the fourth gate 38-4 through an inverter 43-4, and the outputs of first to third AND circuits 43-1 to 43-3 are supplied to the control terminals of the first to third gates 38-1 to 38-3, respectively.

Here, each of the reference values set in the register 41 is selected to be a value that is equal to, for example, about 80% of the upper limit value of the convertible level range of each of the A/D converters 34-1 to 34-4. In addition, it is assumed that the first to fourth comparators 42-1 to 42-4 output "1" if the digital signals from the corresponding first to fourth A/D converters 34-1 to 34-4 are greater than the corresponding reference values, respectively, and that output "0" if the digital signals from the corresponding first to fourth A/D converters 34-1 to 34-4 are shorter than the corresponding reference values, respectively.

With the construction as stated above, like the data selection part as described above with reference to FIG. 4, in case the output of the second amplifier 33-2 exists within the proper convertible level range for the second A/D converter 34-2, for example, each of the outputs of the first and second comparators 42-1 and 42-2 becomes "0" and each of the outputs of the third and fourth comparators 42-3 and 42-4 becomes "1" so that the input conditions of the first to third AND circuits 43-1 to 43-3 and the input condition of the inverter 43-4 are identical with those of the first to third AND circuits 39-1 to 39-3 and the inverter 39-4 in the data selection part shown in FIG. 4, and hence only the second gate 38-2 is opened. As a result, only the output digital signal of the second A/D converter 34-2 can be selected. Further, in case of selecting a digital signal by utilization of the outputs of the first to fourth comparators 42-1 to 42-4 discussed above, there may be used in a similar way the above-stated various selection means or techniques each utilizing the overflow-bit.

The one digital signal that is selected as described above from the output digital signals of the first to fourth A/D converters 34-1 to 34-4 is sent to the correction processing part 37. This correction processing part 37 has a characteristic correction part 46 and a scale correction part 48 provided therein in this embodiment and is constructed such that the digital signal inputted to the correction processing part 37 may be scaled down or up in the scale correction part 48, if necessary, so that it has the same value as that of a digital signal in case it is directly converted from an input signal transmitted to the input terminal 31, and/or in the characteristic correction part 46, in case the input-output characteristic of each of the amplifiers 33-1 to 33-4 is not always different from a predetermined gain, the correction therefor may be carried out, if necessary.

These corrections are executed by referring to first to fourth look-up tables 45-1 to 45-4 that are provided in correspondence to the first to fourth amplifiers 33-1 to 33-4, respectively. For example, in case the output digital signal of the second A/D converter 34-2 is selected by the data selection part 36, selection information indicating the fact that the output digital signal of the second A/D converter 34-2 has been selected is transmitted to the correction processing part 37 from the data selection part 36, and so the second look-up table 45-2 corresponding to the second amplifier 33-2 is referred by this transmission of the selection information. The characteristic correction part 46 of the correction processing part 37 is configured such that it obtains correction data relating to the characteristic of the second amplifier 33-2 with reference to the corresponding second look-up table 45-2, and corrects the characteristic of the digital signal inputted thereto so that a digital signal is read out therefrom, which is the same as a digital signal obtained by that an input signal to the second amplifier 33-2 is amplified by its proper accurate gain set in the second amplifier 33-2, a signal amplified by double in this example, and that the amplified signal is converted to a digital signal in the second A/D converter 34-2. The scale correction part 48 is configured such that it obtains correction data relating to the scale with reference to the corresponding second look-up table 45-2, and that corrects in scale the digital signal the characteristic of which has been corrected so that it becomes a digital signal corresponding to the input signal transmitted to the input terminal 31.

In order to generate the above-stated selection information supplied from the data selection part 36 to the correction processing part 37, in the circuit constructions shown in FIGS. 4 and 5, for instance, the control signal supplied to each of the control terminals of the first to fourth gates 38-1 to 38-4 is also supplied to a selection information generating part 47. This selection information generating part 47 is an encoder that converts, for example, a control signal of four bits inputted thereto to a code of two bits, and so the selection information generating part 47 encodes a control signal of four bits inputted thereto to selection information of two bits as shown in FIG. 6, for instance. Specifically, the selection information generating part 47 outputs selection information of "00" in case the output of the first A/D converter 34-1 to which the first amplifier 33-1 the gain of which is one (1) is connected, is selected, outputs selection information of "01" in case the output of the second A/D converter 34-2 to which the second amplifier 33-2 the gain of which is two (2) is connected, is selected, outputs selection information of "10" in case the output of the third A/D converter 34-3 to which the third amplifier 33-3 the gain of which is four (4) is connected, is selected, and outputs selection information of "11" in case the output of the fourth A/D converter 34-4 to which the fourth amplifier 33-4 the gain of which is eight (8) is connected, is selected.

Accordingly, in case of the first embodiment, the output digital signal of the second A/D converter 34-2 is selected, for example, the selection information of "01" is supplied to the correction processing part 37 from the data selection part 36, and therefore, the characteristic correction part 46 and the scale correction part 48 of the correction processing part 37 can refer to the second look-up table 45-2 corresponding to the second amplifier 33-2 the gain of which is two on the basis of the selection information inputted thereto.

The scale correction processing in the scale correction part 48, that is, the processing of correcting the scale of an input digital signal to that of a digital signal corresponding to the input signal transmitted to the input terminal 31 can be carried out by referring to the look-up table on the basis of the supplied selection information and dividing the digital signal selected by the data selection part 36 by the gain of the amplifier connected to the A/D converter which has outputted the selected digital signal. For example, if the gain of the amplifier is two, the digital signal is divided by two. This may be performed by shifting the digital signal rightward by one bit in the register in which the digital signal is stored in the scale correction part 48. As already described, if the gains of the first to fourth amplifiers 33-1 to 33-4 are set to values such as 1, 2, 4, 8 corresponding to the power of 2, this scale correction can be performed by merely shifting the digital data rightward by the number of power in the register, which results in an advantage that the scale correction processing can be done with ease.

Further, the selection information may be one by which the gain of the amplifier can be known in the correction processing part 37, the amplifier being connected to the A/D converter that has outputted the digital data selected by the data selection part 36, and what kind or form of information may be used. As shown in FIG. 6, in case the four A/D converters 34-1 to 34-4 are numbered by binary number system or binary digits, a relationship between gains for correcting the scale depending upon each number and binary digit numbers may be previously described in the look-up tables. Alternatively, if a relationship between gains for correcting the scale depending upon each number and binary digit numbers may be provided in the correction processing part 37, the scale correction can be done in the scale correction part 48 of the correction processing part 37 without referring to the look-up tables.

Figure 7A:
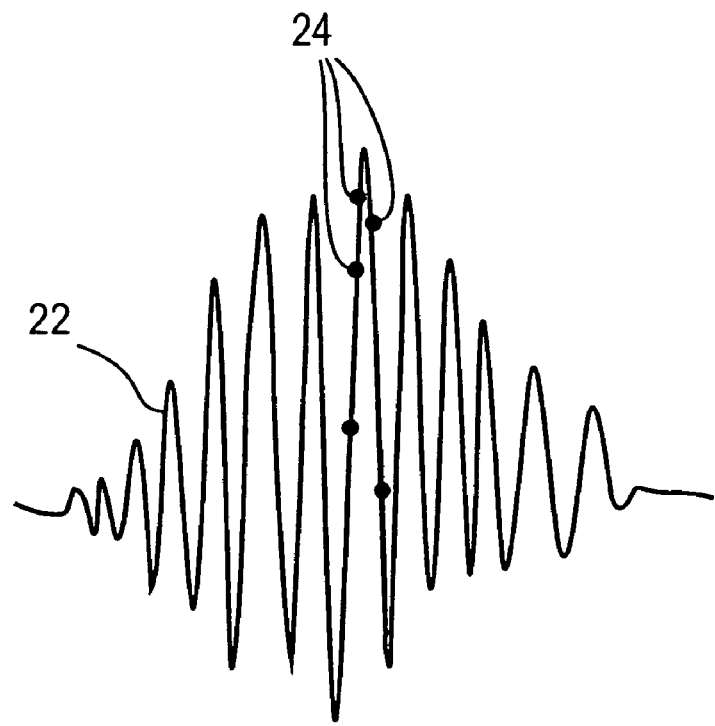
FIG. 7A is an illustration showing a waveform and sample points for explaining the effects of the present invention.
Figure 7B:
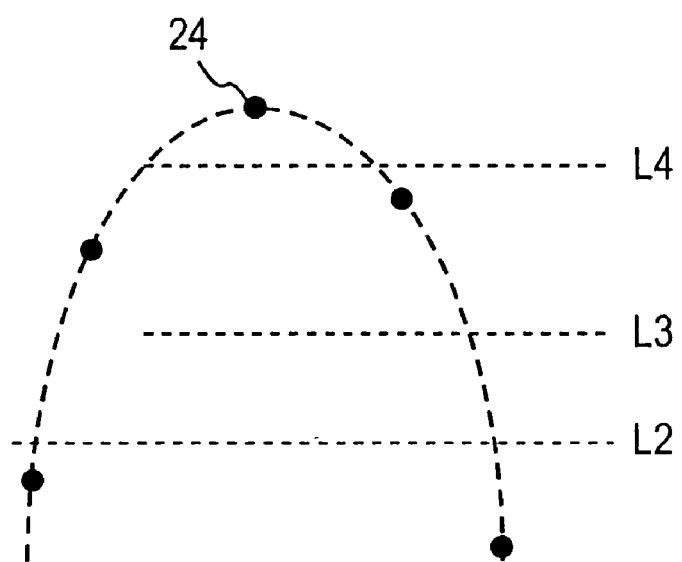
FIG. 7B is an illustration for explaining a manner of gain control in the A/D conversion apparatus according to the present invention.

As described above, in this first embodiment, the A/D conversion apparatus is arranged to utilize digital outputs outputted from the A/D converters 34-1 to 34-4 every sample to select a digital signal which is amplified by the amplifier corresponding to the most proper range for an input signal (level range of an input signal) and converted to that digital signal by the corresponding A/D converter. For example, in case an input signal as shown by a solid line 22 in FIG. 7A is supplied to the input terminal 31, assuming that the input signal 22 is sampled at points each being indicated by a black point or dot, portions near these sample points 24 are shown in FIG. 7B in enlarged scale wherein the time base is particularly enlarged. In addition, assuming that levels for changing the level range of an input signal, that is, operation levels for determining that an output from which one of the amplifiers should be A/D converted, are denoted by L4, L3 and L2 as shown in FIG. 7B, in case the level of an input signal is greater than L4, a digital signal is selected, which is obtained by A/D converting the output of the first amplifier 33-1 having its gain of 1, in case the level of an input signal comes in the range between L3 and L4, a digital signal is selected, which is obtained by A/D converting the output of the second amplifier 33-2 having its gain of 2, in case the level of an input signal comes in the range between L2 and L3, a digital signal is selected, which is obtained by A/D converting the output of the third amplifier 33-3 having its gain of 4, and in case the level of an input signal is lower than L2, a digital signal is selected, which is obtained by A/D converting the output of the fourth amplifier 33-4 having its gain of 8.

Figure 2A:
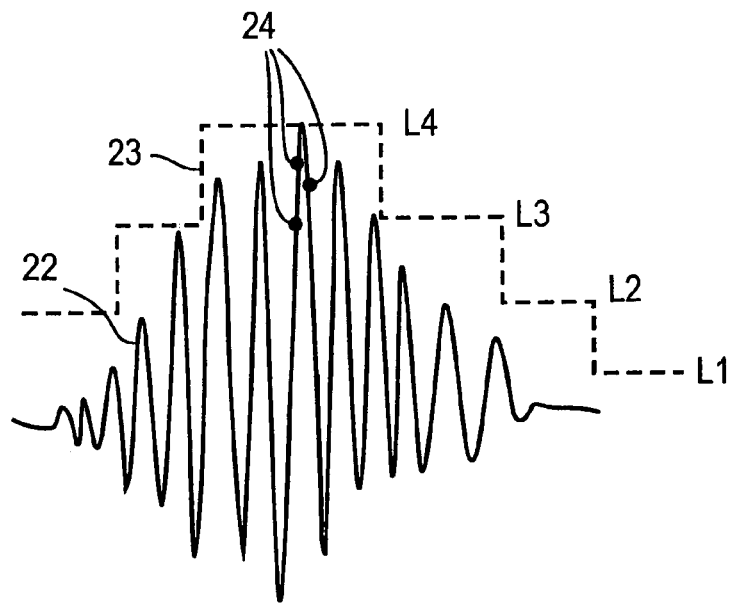
FIG. 2A is a waveform diagram for explaining a waveform of an input signal and a manner of gain control in the A/D conversion apparatus shown in FIG. 1.
Figure 2B:
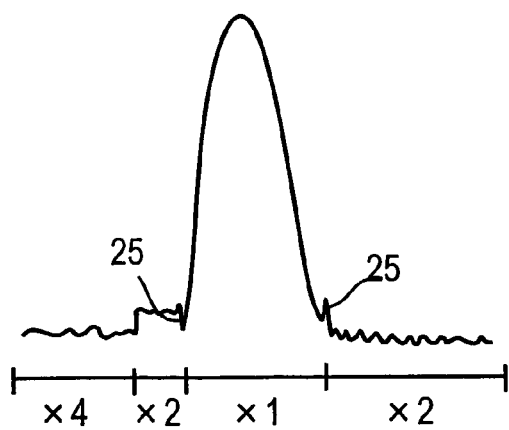
FIG. 2B is a diagram showing one example of the amplitude-frequency characteristic of an input signal in the A/D conversion apparatus shown in FIG. 1.

In such way, for each sample, an input signal is amplified by an amplifier having its gain corresponding to the level of the sample data so that the level thereof comes within the proper convertible level range of the corresponding A/D converter, and then it is converted to a digital signal by the corresponding A/D converter, this digital signal being selected. Therefore, as compared with the case that the gain of the amplifier is controlled for plural samples like the prior art shown in FIG. 2A, a digital signal with higher accuracy can be obtained, and further, in case of making a display as shown in FIG. 2B, a waveform obtained thereby does not vary stepwise, and a continuously varied waveform with high precision can be obtained as if it would be analogously processed. In addition, the gain of each amplifier is not controlled at all, and a digital signal is selected, which is obtained by A/D converting the output amplified by corresponding one amplifier. Accordingly, there is no possibility that any whisker-like or impulse-like noise is generated due to control of the gain.

Further, if there are used the A/D converters 34-1 to 34-4 each having 14 bits, after completion of the scale correction, quantization error for an input signal the level of which is equal to or greater than level L4 becomes $\frac{1}{2}^{14}$, quantization error for an input signal the level of which comes between level L3 and level L4 becomes a half of $\frac{1}{2}^{14}$, quantization error for an input signal the level of which comes between level L2 and level L3 becomes a quarter of $\frac{1}{2}^{14}$, and quantization error for an input signal the level of which is equal to or lower than level L2 becomes one-eighth of $\frac{1}{2}^{14}$.

Next, a second embodiment of the A/D conversion apparatus according to the present invention will be described in detail with reference to FIGS. 8 to 10.

Figure 8:
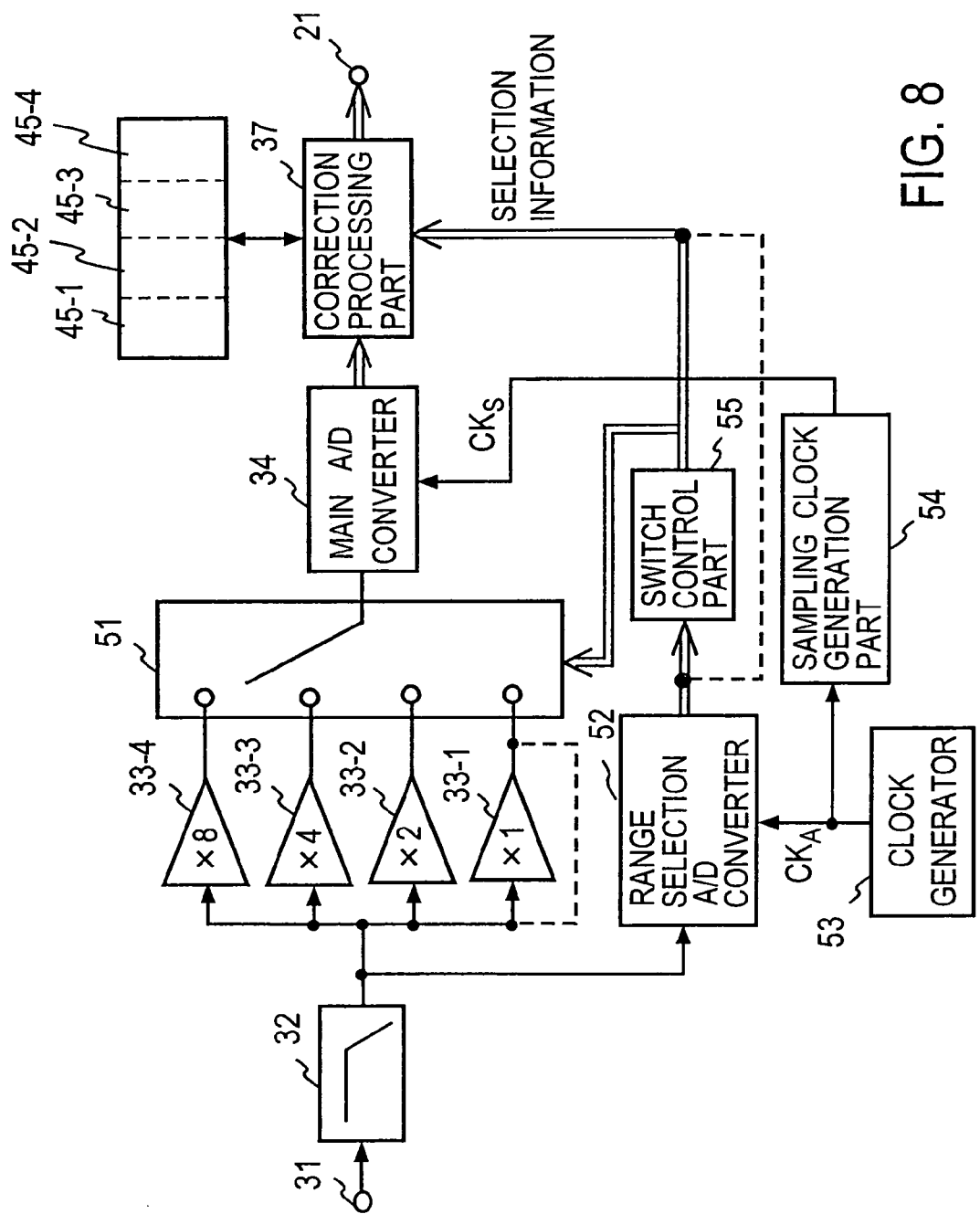
FIG. 8 is a block diagram showing a second embodiment of the A/D conversion apparatus according to the present invention.

FIG. 8 is a block diagram showing a second embodiment of the A/D conversion apparatus according to the present invention, and in FIG. 8, elements and portions corresponding to those in the first embodiment will be denoted by the same reference numbers or characters attached thereto and explanation thereof will be omitted unless necessary. In this second embodiment, though an input signal from the input terminal 31 is supplied, after it has passed through the anti-aliasing filter 32, to four amplifiers (or four level controllers that differ in their control variables from one another) 33-1 to 33-4 that differ in their gains from one another, there is provided only one main A/D converter 34 for converting signals outputted respectively from the first to fourth amplifiers 33-1 to 33-4 to digital signals. However, the second embodiment is configured such that the signals outputted y from the first to fourth amplifiers 33-1 to 33-4 are supplied to a selection switch 51 which selects one of the signals supplied thereto to supply the selected signal to the main A/D converter 34. Further, the gains of the first to fourth amplifiers 33-1 to 33-4 are the same as those in the first embodiment, and so the gain of the first amplifier 33-1 is set to one (1), the gain of the second amplifier 33-2 is set to two (2), the gain of the third amplifier 33-3 is set to four (4), and the gain of the fourth amplifier 33-4 is set to eight (8). In addition, like the first to fourth A/D converters 34-1 to 34-4 shown in FIG. 3, the main A/D converter 34 converts an input signal to a digital signal with high resolution to be required within its convertible level range.

The selection switch 51 is controlled depending upon the magnitude of level of an input signal, that is, depending upon a range (level range) to which the level of an incoming input signal belongs. For this reason, after an input signal has passed through the anti-aliasing filter 32, it is branched to a range selection A/D converter 52. This range selection A/D converter 52 has its resolution considerably lower than that of the main A/D converter 34, but it operates by application of a sampling pulse the frequency of which is higher than the sampling frequency for the main A/D converter 34, and the operation speed of the range selection A/D converter 52 is selected such that before the main A/D converter 34 receives a signal at one sample point, selection of one of the outputs of the amplifiers by the selection switch 51 has been completed as well as before the main A/D converter 34 receives a signal at the succeeding sample point, the selection switch 51 can carry out a next selection of one of the outputs of the amplifiers.

For example, from a clock generator 53 is generated a clock $CK_A$ the frequency of which is twice as high as the frequency of a sampling clock $CK_S$ to be supplied to the main A/D converter 34, and the clock $CK_A$ is supplied to the range selection A/D converter 52 thereby to operate the A/D converter 52 to sample. At the same time, the clock $CK_A$ is also supplied to a sampling clock generation part 54 which in turn divides the frequency of the clock $CK_A$ by 2 and controls or adjusts the phase thereof. The frequency-divided clock is supplied to the main A/D converter 34 as a sampling clock $CK_S$.

Figures 10A, 10B, 10C, 10D:
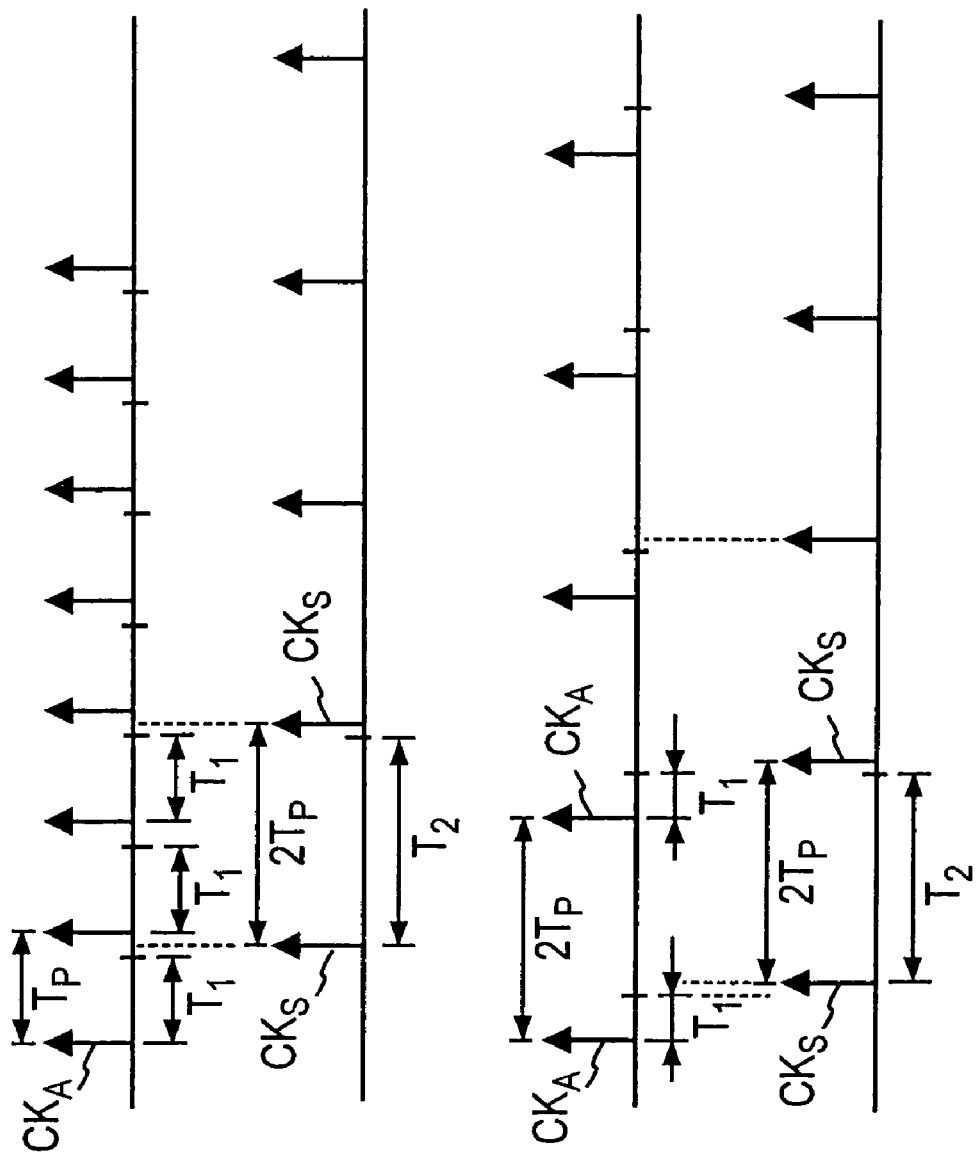
FIG. 10 is an illustration showing a relationship between a sampling clock $CK_S$ for the main A/D converter and a range selection clock $CK_A$ in the A/D conversion apparatus shown in FIG. 8.

The operations of the main A/D converter 34 and the range selection A/D converter 52 discussed above will be specifically described with reference to FIG. 10. As shown in FIG. 10A, for instance, it is assumed that a clock $CK_A$ having its period of $T_P$ is generated from the clock generator 53, an input signal is sampled and converted to a digital signal in the range selection A/D converter 52 every clock $CK_A$, and a time required to convert the sampled signal to a digital signal is $T_1$. In this case, as shown in FIG. 10B, a sampling clock $CK_S$ having its period of $2T_P$ is supplied from the sampling clock generation part 54 to the main A/D converter 34 at the time point that the sampling clock $CK_S$ is delayed in phase from each clock $CK_A$ by more than the time $T_1$. On the other hand, in the main A/D converter 34, assuming that a time required to convert the sampled signal to a digital signal is $T_2$ every sampling, in order to make the operation thereof as fast as possible, generally, the sampling period $2T_P$ of the main A/D converter 34 is set to one which is a little larger than the time T2 required for A/D conversion.

The digital output of the range selection A/D converter 52 is supplied to a switch control part 55. As will be understood from FIGS. 10A and 10B, a control signal corresponding to an digital output every second clock $CK_A$ is supplied to the selection switch 51 through the switch control part 55 thereby to control the switching operation of the selection switch 51. That is, the digital output of the range selection A/D converter 52 is inputted to the switch control part 55 in which to which range the level of the input signal supplied to the input terminal 31 belongs is determined, and a control signal is generated in the switch control part 55 on the basis of such determination and applied to the selection switch 51, the control signal instructing as to which output among the outputs of the amplifiers 33-1 to 33-4 is to be selected. As a result, the selection switch 51 is controlled to select one amplifier instructed by the control signal applied thereto.

Like the above-mentioned first embodiment, in case the first to fourth amplifiers 33-1 to 33-4 are used, it may suffice to determine to which range among the four ranges the level of the input signal belongs. Accordingly, the range selection A/D converter 52 may suffice to output four range selection digital signals corresponding to the four ranges, and hence may be one which is capable of converting the level of an input signal to a digital signal of at least two bits. In case of converting the level of an input signal to a digital signal of two bits, four range selection signals of "00", "01", "10" and "11"can be outputted from the range selection A/D converter 52 and supplied to the switch control part 55. Consequently, as shown in FIG. 9 for instance, it may be configured that in case the output digital signal is "00", a control signal for selecting the amplifier 33-4 having its gain of 8, in case the output digital signal is "01", a control signal for selecting the amplifier 33-3 having its gain of 4, in case the output digital signal is "10", a control signal for selecting the amplifier 33-2, and in case the output digital signal is "11", a control signal for selecting the amplifier 33-1 are generated from the switch control part 55 and applied to the selection switch 51 thereby to control the switch 51 to connect the amplifier corresponding to each control signal to the main A/D converter 34.

With the construction as discussed above, an input signal that the main A/D converter 34 is to sample is properly amplified by the corresponding amplifier depending upon the level of the input signal and is inputted to the main A/D converter 34 immediately before the main A/D converter 34 samples. Accordingly, it is apparent that the same function and effects as in the first embodiment already described can be obtained, and explanation thereof will be omitted.

Since it is required that the selection switch 51 operates at high speed, it may be constructed by a switch circuit using, for example, PIN diodes. In such case, the switch control part 55 will generate control signals each of which controls corresponding one of the PIN diodes of the selection switch 51 to turn on and/or off.

The output digital signal from the main A/D converter 34 is corrected and processed in the correction processing part 37 as in the above-stated first embodiment. As selection information in such case, the control signals from the switch control part 55 or the output signal from the range selection A/D converter 52 can be used. The range selection A/D converter 52 is one having a few bits, and so it is available by low cost even it operates at high speed. Accordingly, as shown in FIG. 10C, it may be arranged that the period of the clock $CK_A$ generated from the clock generator 53 is set to $2T_p$ that is equal to the period of the sampling clock $CK_S$ outputted from the sampling clock generation part 54, and that as shown in FIG. 10D, the sampling clock $CK_S$ is outputted from the sampling clock generation part 54 by delaying the sampling clock $CK_S$ from the clock $CK_A$ by a time which is a little greater than the time $T_1$.

Further, in the second embodiment described above, in case there is a possibility that a whisker-like or impulse-like noise is generated due to the switching operation of the selection switch 51, since the period of the switching control of the selection switch 51 is the same as that of the sampling clock $CK_S$, the phase of the period of the switching control of the selection switch 51 may be shifted to such an extent that the generated noise is not sampled by the sampling clock $CK_S$.

The above-discussed first and second embodiments are in common with each other in the point that each is constructed such that an input signal is concurrently inputted to a plurality of amplifiers the gains of which are different from one another, and that depending upon to which range the level of the input signal belongs, the output of the corresponding amplifier is converted to a digital signal which is, in turn, selected and outputted. In these embodiments, the first amplifier 33-1 having its gain of 1 may be not used. That is, as shown in FIGS. 3 and 8 by a broken line, the circuit connection may be changed such that the output of the anti-aliasing filter 32 can be supplied directly to the first A/D converter 34-1 or the selection switch 51. However, in view of making the input-output impedance and phase characteristic uniform, and the like, it is preferable that the amplifier 33-1 having its gain of 1 is used. In addition, as mentioned above, the number of amplifiers is not limited to four. Taking into consideration the fact that the amplifier 33-1 having its gain of 1 may be omitted, it suffices that at least one amplifier the gain of which is greater than 1 is used. If the number of amplifiers is increased, there is obtained an advantage that an A/D converter that outputs a signal of a little bits, operates at high speed and is inexpensive may be used as an A/D converter for converting the output of selected one amplifier to a digital signal. Alternatively, if the number of bits of a signal outputted from each A/D converter is not changed (decreased), the resolution of each A/D converter is improved.

Furthermore, in the first and second embodiments, though the level control of an input signal has been effected by use of amplifiers, they may be done by use of an attenuator or attenuators or by use of both an amplifier or amplifiers and an attenuator or attenuators. In short, it suffices that at least one level controller is used. In addition, in the first and second embodiments, in case control for each level controller can be precisely performed as requested, correction of the characteristic in the correction processing part 37 may be omitted.

Next, a third embodiment of the A/D conversion apparatus according to the present invention will be described in detail with reference to FIGS. 11 to 13.

Figure 11:
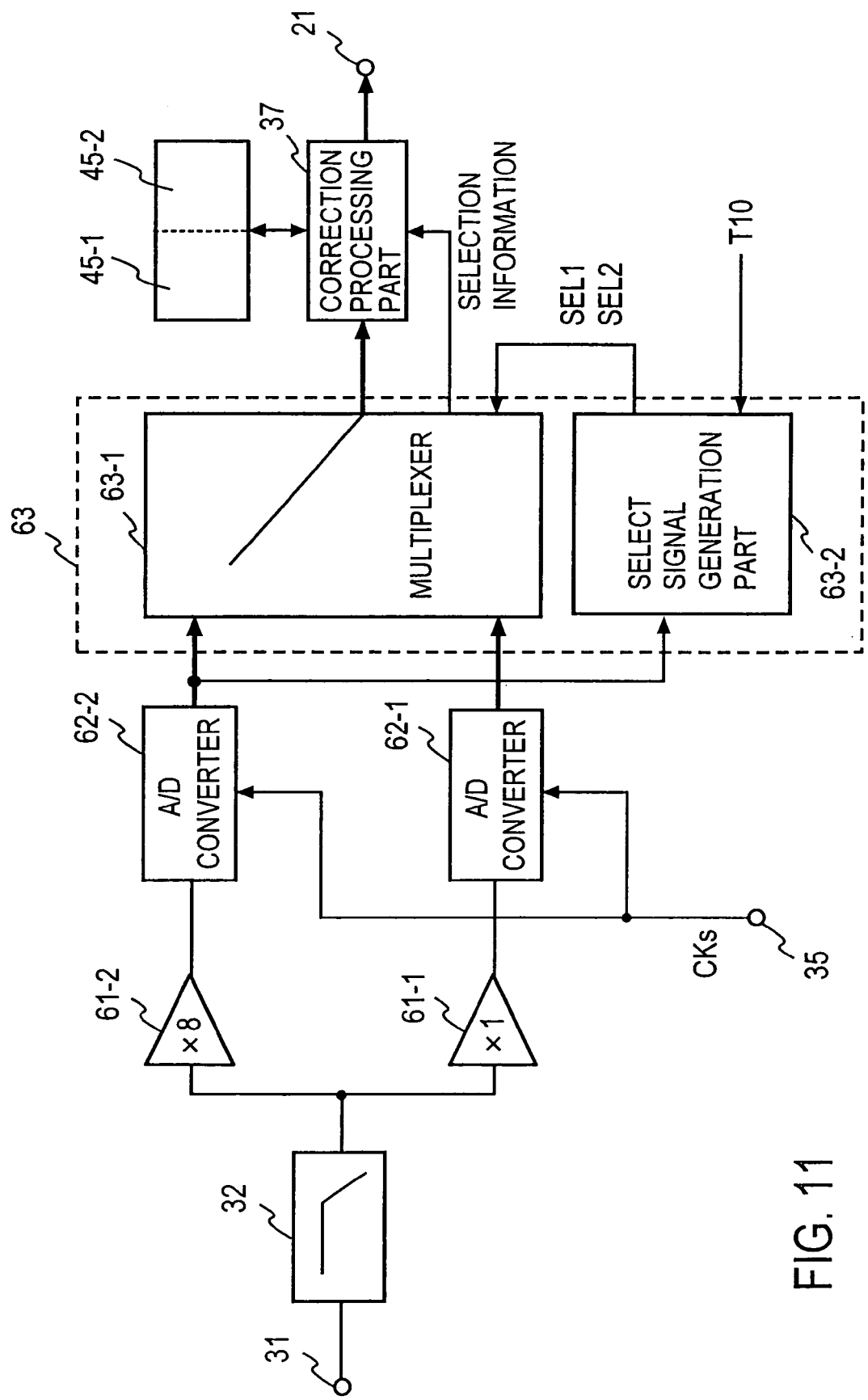
FIG. 11 is a block diagram showing a third embodiment of the A/D conversion apparatus according to the present invention.

FIG. 11 is a block diagram showing a third embodiment of the A/D conversion apparatus according to the present invention, and in FIG. 11, elements and portions corresponding to those in the first and second embodiments will be denoted by the same reference numbers or characters attached thereto and explanation thereof will be omitted unless necessary. In this third embodiment, an input signal from the input terminal 31 is supplied, after it has passed through the anti-aliasing filter 32, to first and second amplifiers (or two level controllers that differ in their control variables from each other) 61-1 and 61-2. The gains of the these amplifiers 61-1 and 61-2 are fixed, and in this third embodiment, the gain of the first amplifier 61-1 is set to one (1), and the gain of the second amplifier 61-2 is set to eight (8). These gains are merely by way of example, and they may be set to other values or may be set to another values except for values of the power of 2 as in the above example.

Outputs from the amplifiers 61-1 and 61-2 are supplied to corresponding first and second A/D converters 62-1 and 62-2, respectively. These A/D converters 62-1 and 62-2 have the same characteristic, that is, they are configured such that the convertible range in level of each of the A/D converters 62-1 and 62-2 is the same as well as they have the same resolution, and they are operated by the same clock $CK_S$ supplied from a clock terminal 35 thereby to convert outputs from the corresponding amplifiers 61-1 and 61-2 to digital signals with requested resolutions within their convertible level ranges. In addition, though not shown in the figure, each of the A/D converters 62-1 and 62-2 is provided with the sample-and-hold circuit 16 of the prior art A/D conversion apparatus shown in FIG. 1 built therein. Further, in case the sample-and-hold circuit is not built therein, it is inserted before each of the A/D converters 62-1 and 62-2.

Output digital signals from the A/D converters 62-1 and 62-2 are inputted to a data selection part 63. The data selection part 63 comprises a multiplexer 63-1 and a select signal generation part 63-2, and digital signals outputted from the A/D converters 62-1 and 62-2 are inputted to the multiplexer 63-1. The data selection part 63 selects a proper digital signal corresponding to the magnitude in level of the input signal from the input terminal 31 and supplies the selected digital signal to a correction processing part 37. Like the above-stated first embodiment, the correction processing part 37 has a characteristic correction part and a scale correction part provided therein though not shown in the figure, and is constructed such that in case the input-output characteristic of each of the amplifiers 61-1 and 61-2 is not always different from a predetermined gain, a digital signal inputted to the correction processing part 37 may be corrected with reference to a first look-up table 45-1 or a second look-up table 45-2 in characteristic correction part, and in the scale correction part, it may be scaled down or up so that it has the same value as that of a digital signal obtained by directly digital-converting an input signal transmitted to the input terminal 31.

In this third embodiment, the apparatus is arranged such that a pre-estimated fluctuation range in the levels of input signals are divided into two ranges, and depending upon to which divided level range the level of an input signal belongs, an output digital signal from the corresponding A/D converter is selected. This switching of the range is carried out by utilizing the fact that when the level of an input signal to the second A/D converter 62-2 is beyond the convertible level range thereof, the second A/D converter 62-2 overflows so that the overflow-bit of the converted output digital signal becomes "1". Specifically, the digital signal outputted from the second A/D converter 62-2 is also inputted to the select signal generation part 63-2 of the data selection part 63, and when the overflow-bit of the digital signal outputted from the second A/D converter 62-2 is "0", the select signal generation part 63-2 supplies a select signal SEL2 (for example, a signal of logical high level) for selecting the second A/D converter 62-2 to the multiplexer 63-1 thereby to cause the multiplexer 63-1 to select the digital signal of the second A/D converter 62-2, and when the second A/D converter 62-2 overflows so that the overflow-bit of the digital signal outputted therefrom becomes "1", the select signal generation part 63-2 immediately supplies a select signal SEL1 (for example, a signal of logical low level) for selecting the first A/D converter 62-1 to the multiplexer 63-1 thereby to cause the multiplexer 63-1 to select the output digital signal of the first A/D converter 62-1. In addition, when the digital signal of the first A/D converter 62-1 is being selected, the overflow-bit of the output digital signal of the second A/D converter 62-2 turns to "0" and if this overflow-bit "0" does not turn to "1" within a preset time T10, the select signal generation part 63-2 supplies the select signal SEL2 to the multiplexer 63-1 thereby to cause the multiplexer 63-1 to select the output digital signal of the second A/D converter 62-2. Further, only the overflow-bit of the digital signal outputted from the second A/D converter 62-2 may be inputted to the select signal generation part 63-2.

Figure 12:
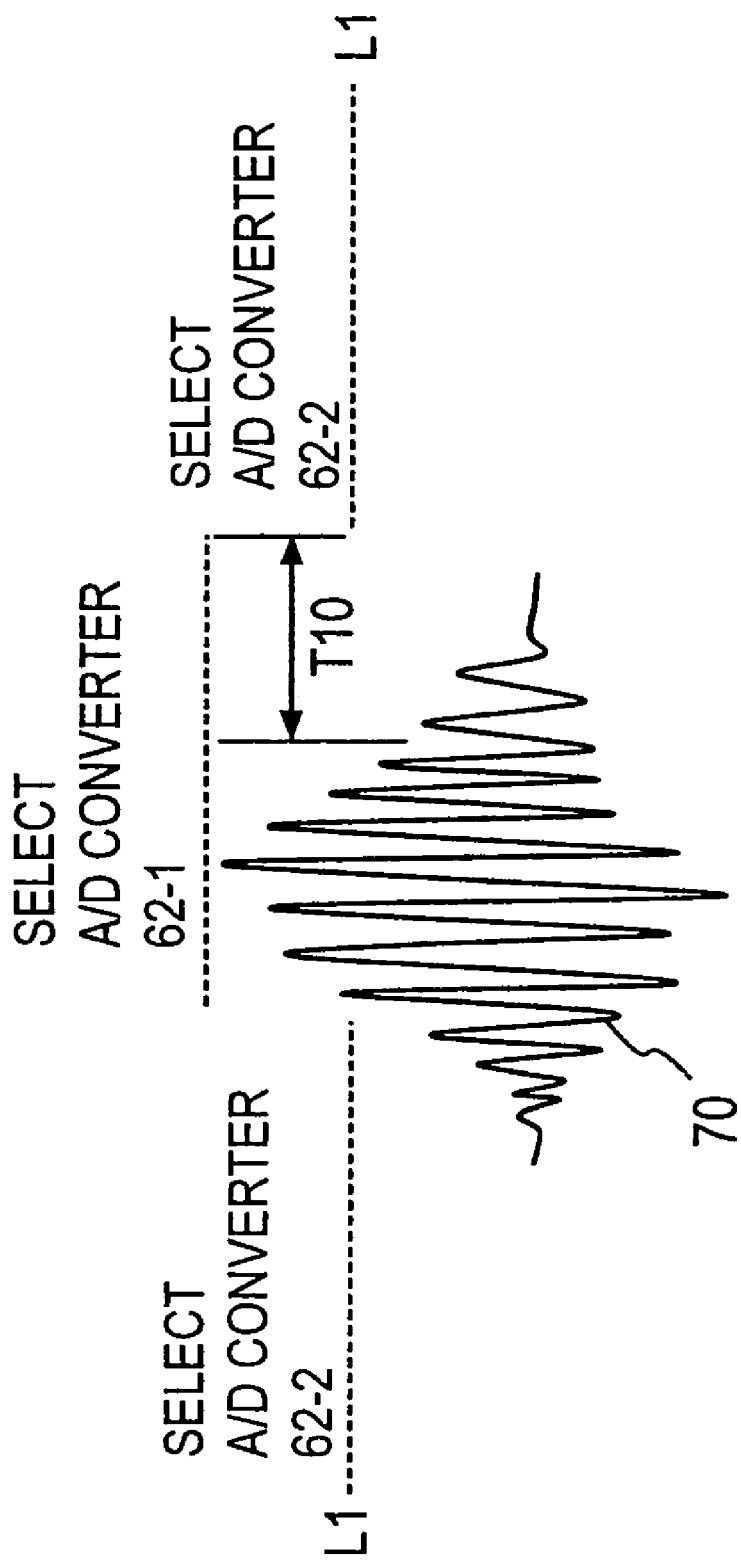
FIG. 12 is an illustration for explaining the operation of the A/D conversion apparatus shown in FIG. 11.

For example, in case an input signal as shown in FIG. 12 by a solid line 70 is supplied to the input terminal 31, assuming that a level for changing the level range of this input signal 70, that is, an operation level for determining that an output from which one of the amplifiers should be A/D converted, is denoted by L1 as shown in the figure, while the level of the input signal is lower than L1, a digital signal is selected, which is obtained by A/D converting the output of the second amplifier 61-2 having its gain of 8, and when the level of the input signal comes to larger than L1, a digital signal is selected at once, which is obtained by A/D converting the output of the first amplifier 61-1 having its gain of 1. In addition, while the digital signal obtained by A/D converting the output of the first amplifier 61-1 having its gain of 1 is being selected because the level of the input signal has come to larger than L1, the overflow-bit of the output digital signal of the second A/D converter 62-2 turns to "0" and if this overflow-bit "0" does not turn to "1" within a preset time T10, then the digital signal obtained by A/D converting the output of the second amplifier 61-2 having its gain of 8 is selected.

Figure 13:
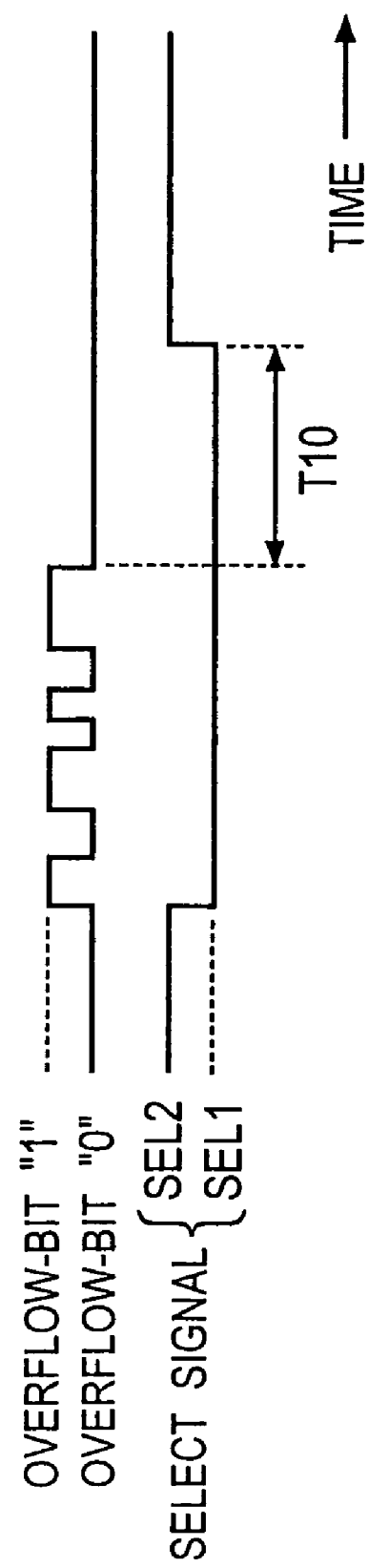
FIG. 13 is a timing chart for explaining the operation of the A/D conversion apparatus shown in FIG. 11.

A relationship between the overflow-bit of the second A/D converter 62-2 and the select signals outputted from the select signal generation part 63-2 is shown in FIG. 13 by a time chart. In case the overflow-bit of the second A/D converter 62-2 is "0" as well as goes to "0" from "1" and continues to keep "0" during and after the preset time T10 has passed, the select signal generation part 63-2 outputs the select signal SEL2 for selecting the output digital signal of the second A/D converter 62-2 and supplies it to the multiplexer 63-1. On the other hand, it will be easily understood that when the overflow-bit of the second A/D converter 62-2 goes to "1" from "0", the select signal generation part 63-2 immediately outputs the select signal SEL1 for selecting the output digital signal of the first A/D converter 62-1 and supplies it to the multiplexer 63-1, and yet, the select signal generation part 63-2 continues to output the select signal SEL1 even if the overflow-bit goes to "0" from "1" and if a time that the overflow-bit remains "0" is shorter than the preset time T10.

Further, the above-stated preset time T10 is set to the optimum time taking signals to be measured and various requirements of measuring instruments or apparatus into consideration, and for example, may be set to 1/RBW (resolution bandwidth).

As stated above, the third embodiment is arranged such that an input signal is concurrently inputted to two amplifiers the gains of which is different from each other, and there is selected a digital signal which is amplified by one of the amplifiers corresponding to the most suitable range for the input signal (the level range of the input signal) and converted by the corresponding A/D converter by utilization of the overflow-bit of the digital signal outputted from the second A/D converter 62-2 every sample. Accordingly, for each sample, an input signal is amplified by an amplifier having its gain corresponding to the level of the sample data so that the level thereof comes within the proper convertible level range of the corresponding A/D converter, and then it is converted to a digital signal by the corresponding A/D converter, this digital signal being selected. Therefore, as compared with the case that the gain of the amplifier is controlled for plural samples like the prior art shown in FIG. 2A, a digital signal with higher accuracy can be obtained. In addition, the gain of each amplifier is not controlled at all, and a digital signal is selected, which is obtained by A/D converting the output amplified by corresponding one amplifier. Accordingly, there is no possibility that any whisker-like or impulse-like noise is generated due to control of the gain.

Further, in the third embodiment, too, the first amplifier 61-1 having its gain of 1 may be not used. That is, as in the aforementioned first and second embodiments, the circuit connection may be changed such that the output of the anti-aliasing filter 32 can be supplied directly to the first A/D converter 62-1. However, in view of making the input-output impedance and phase characteristic uniform, and the like, it is preferable that the amplifier 61-1 having its gain of 1 is used. In addition, taking into consideration the fact that the amplifier 61-1 having its gain of 1 may be omitted, it suffices that at least one amplifier the gain of which is greater than 1 is used. Moreover, though the level control of an input signal has been effected by use of amplifiers, they may be done by use of an attenuator or attenuators or by use of both an amplifier or amplifiers and an attenuator or attenuators. In short, it suffices that at least one level controller is used. In such case, if control for each level controller can be precisely performed as requested, correction of the characteristic in the correction processing part 37 may be omitted.

In the third embodiment, an amplifier the gain of which is fixed has been used as the second amplifier 61-2, and it may be constructed such that an amplifier the gain of which is variable is used as the second amplifier 61-2 and when the setting of the measuring resolution bandwidth of a measuring apparatus is changed, the gain of this variable gain amplifier is changed and set to the optimum fixed value before the measurement is started.

Figure 14:
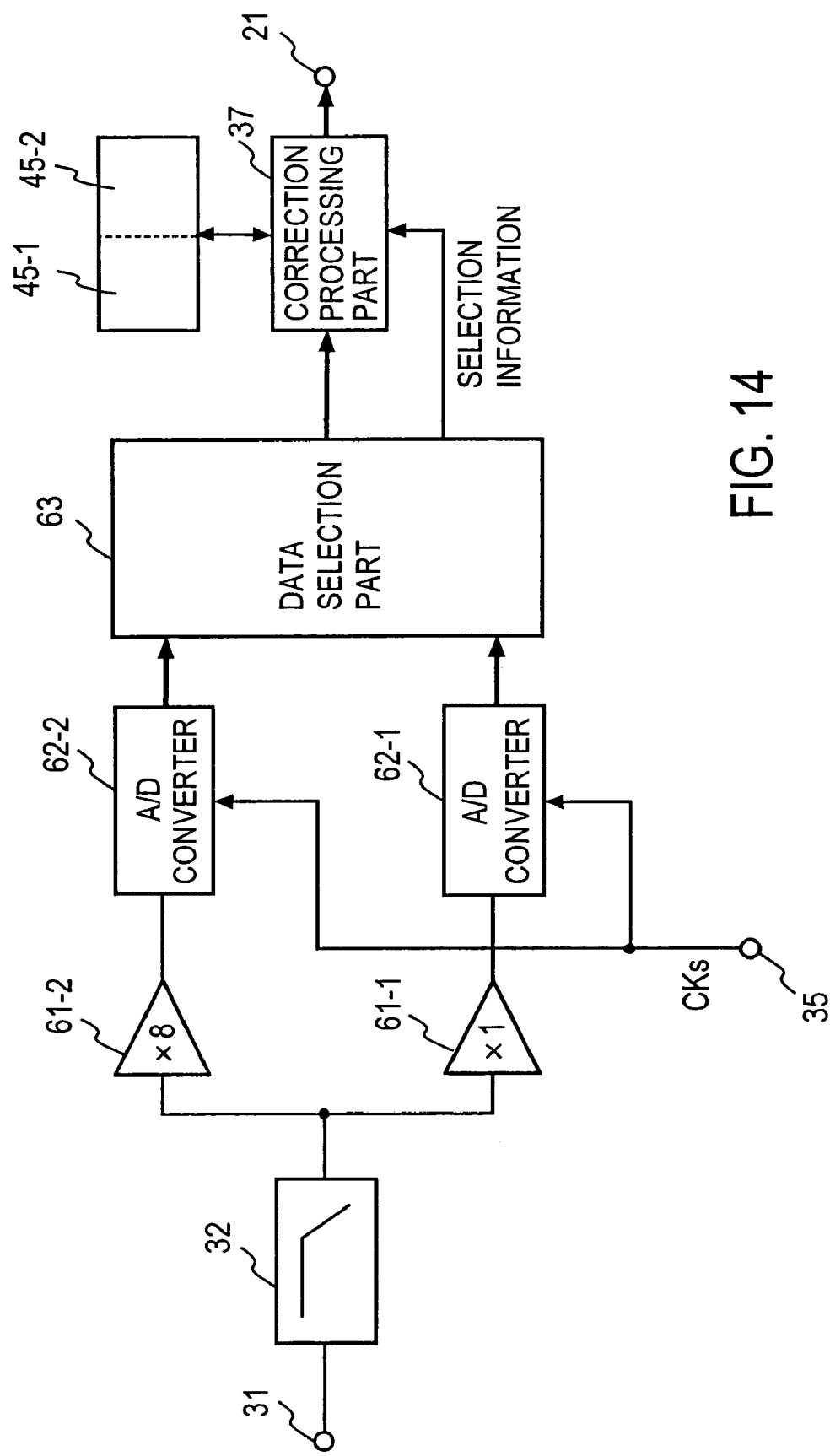
FIG. 14 is a block diagram showing a fourth embodiment of the A/D conversion apparatus according to the present invention.

FIG. 14 is a block diagram showing a fourth embodiment of the A/D conversion apparatus according to the present invention. As stated above, this fourth embodiment is constructed such that a variable gain amplifier is used as the second amplifier and when the setting of the measuring resolution bandwidth of a measuring apparatus is changed, the gain of this variable gain amplifier is set to the optimum fixed value before the measurement is started.

As is clear from FIG. 14, in the fourth embodiment, there are provided first and second amplifiers 61-1 and 61-2 as well as first and second A/D converters 62-1 and 62-2 for converting outputs of these amplifiers 61-1 and 61-2 to digital signals respectively. Except that the gain of the first amplifier 61-1 is set to one (1), and the gain (N) of the second amplifier 61-2 is variable, other arrangement and/or construction thereof is similar to that of the first embodiment, and so in FIG. 14, elements and portions corresponding to those in the first and third embodiments will be denoted by the same reference numbers or characters attached thereto and explanation thereof will be omitted unless necessary.

As mentioned above, when the setting of the measuring resolution bandwidth of a measuring apparatus is changed, the gain (N) of the second amplifier 61-2 is previously set to the optimum fixed value (for example, a specified fixed value such as 2, 4 or 8 corresponding to the setting of the measuring resolution bandwidth) before the measurement is started. A digital signal selected by the data selection part 36 is corrected and processed in the correction processing part 37. Thereafter, further necessary processing for the digital signal is executed in a digital signal processing part subsequent to the correction processing part 37, and for example, it is requested that the more the bandwidth of a resolution bandwidth filter becomes narrow, the more the dynamic ranges of the A/D converters 62-1 and 62-2 are wide. Accordingly, if the gain of the second amplifier 61-2 is made variable like the fourth embodiment and when the measuring resolution bandwidth is set before the measurement is started, the gain of the second amplifier 61-2 is set, simultaneously therewith, to the optimum value (fixed value) corresponding to this set measuring resolution bandwidth, an input signal can be converted to a digital signal with high accuracy.

With the construction as discussed above, there is selected a digital signal which is amplified by one amplifier corresponding to the most suitable range for an input signal (the level range of an input signal) and converted by the corresponding A/D converter by utilization of the digital signals outputted from the A/D converters 62-1 and 62-2 every sample. Accordingly, it is apparent that the same function and effects as in the first embodiment already described can be obtained, and explanation thereof will be omitted.

Further, in the fourth embodiment, too, the first amplifier 61-1 having its gain of 1 may be not used. That is, as in the aforementioned first and second embodiments, the circuit connection may be changed such that the output of the anti-aliasing filter 32 can be supplied directly to the first A/D converter 62-1. However, in view of making the input-output impedance and phase characteristic uniform, and the like, it is preferable that the amplifier 61-1 having its gain of 1 is used. In addition, though the level control of an input signal has been effected by use of the amplifiers, they may be done by use of an attenuator or attenuators or by use of both an amplifier or amplifiers and an attenuator or attenuators. In short, it suffices that at least one level controller is used. In such case, if control for each level controller can be precisely performed as requested, correction of the characteristic in the correction processing part 37 may be omitted.

As is clear from the foregoing, in accordance with the present invention, for each sample of an input signal, a level range suitable for the input signal is determined, and the input signal is converted to a digital signal after it is controlled in its level in accordance therewith or without controlling its level. Therefore, there is no need to use any envelope detector and any gain controller like the prior art, and so a remarkable advantage is obtained that any input signal can be converted to a digital signal with high precision. In addition, an input signal is controlled in its level by each level controller and converted to a digital signal, and this converted digital signal is selected. As a result, a higher accurate digital signal is obtained, and yet, there is no possibility that any whisker-like or impulse-like noise is generated due to control of the gain.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. An analog-to-digital conversion apparatus comprising:
   at least one level controller that controls the level of an input signal;
   a plurality of analog-to-digital converters, wherein an analog-to-digital converter converts the input signal, the level of which is not controlled, to a digital signal; and wherein
   at least one of the plurality of analog-to-digital converters is coupled to a corresponding level controller to convert the input signal, the level of which is controlled by the corresponding level controller, to a digital signal; and
   selection means that selects and outputs one of the digital signals converted respectively by the plurality of analog-to-digital converters depending upon levels of the digital signals.

2. The analog-to-digital conversion apparatus as set forth in claim 1, wherein
   said selection selects, in case the plural analog-to-digital converters are ranked in order of the magnitudes of the levels of input signals inputted thereto, the output digital signal of the analog-to-digital convertor the overflow-bit of which is "0" and the rank of which is immediately lower than that of the analog-to-digital converter the overflow-bit of the output digital signal of which is "1".

3. The analog-to-digital conversion apparatus as set forth in claim 1, wherein
   said selection means comprises: a plurality of comparators each comparing the digital signal of each analog-to-digital converter with a reference value; and means that selects, in case the plural analog-to-digital converters are ranked in order of the magnitudes of the levels of input signals inputted thereto, the output digital signal of the analog-to-digital converter corresponding to one of the comparators the output of which is lower than the reference value as wall as the rank of which is immediately lower than that of the analog-to-digital converter corresponding to another one of the comparators the output of which is higher than the reference value.

4. An analog-to-digital conversion apparatus comprising:
   a first analog-to-digital converter that converts an input signal, the level of which is not controlled, to a digital signal;

a level controller that controls the level of the input signal;

a second analog-to-digital converter that converts the input signal the level of which is controlled by the level controller to a digital signal; and selection means that selects and outputs the digital signal outputted from the first analog-to-digital converter when an overflow-bit for the digital signal outputted from the second analog-to-digital converter changes from "0" to "1" and that remains the selection of the digital signal outputted from the first analog-to-digital converter when the overflow-bit for the digital signal outputted front the second analog-to-digital converter changes from "1" to "0" if the stare of "0" changes to "1" within a preset time.

5. An analog-to-digital conversion apparatus comprising:

at least one level controller that controls the level of an input signal;

a main analog-to-digital converter; and selection means that comprises: a range selection analog-to-digital converter the resolution of which is lower than that of the main analog-to-digital convener end to which the input signal is inputted; and a selection switch for supplying to the main analog-to-digital converter or the input signal the level of which is not controlled, depending upon the level of a digital signal converted by the range selection analog-to-digital converter.

6. The analog-to-digital conversion apparatus as set forth in any one of claims 1 to 4, further including:

selection information generation part for generating selection information representing the state of selection of the digital signal;

look-up tables in which for each level controller, the output correction characteristic thereof is stored; and a characteristic correction part for correcting the characteristic of the selected digital signal with reference to the look-up table depending upon the selection information.

7. The analog-to-digital conversion apparatus as set forth in claim 5, further including:

selection information generation part for generating selection information representing the state of selection of the level controller;

look-up tables in which for each level controller, the output correction characteristic thereof is stored; and a characteristic correction part for correcting the characteristic of the digital signal outputted from the main analog-to-digital convener with reference to one of the look-up tables depending upon the selection information.

8. The analog-to-digital conversion apparatus as set forth in any one of claims 1 to 4, further including:

selection information generation part for generating selection information representing the state of selection of the digital signal;

look-up tables in which scale correction data depending upon the level of an input signal are stored; and a scale correction part far correcting the selected digital signal to a digital signal corresponding to the magnitude of the level of the input signal with reference to one of the look-up tables depending upon the selection information.

9. The analog-to-digital conversion apparatus as set forth in claim 5 or 7, further including:

selection information generation part for generating selection information representing the state of selection of the level controller, look-up tables in which scale correction data depending upon the level of an input signal are stored; and a scale correction part for correcting the digital signal outputted from the main analog-to-digital converter to a digital signal corresponding to the magnitude of the level of the input signal with reference to one of the look-up tables depending upon the selection information.

10. The analog-to-digital conversion apparatus as set forth in claim 1, 4 or 5, wherein the level controller has its gain fixed.

11. The analog-to-digital conversion apparatus as set forth in claim 1, 4 or 5, wherein the level controller has its gain that is previously settable.

12. An analog-to-digital conversion method comprising:

converting an input signal, the level of which is not controlled, a first digital signal;

controlling the level of the input signal;

converting the input signal, the level of which is controlled, to a second digital signal; and selecting the first digital signal when an overflow-bit for the second digital signal is "1" and selecting the second digital signal when the overflow-bit for the second digital signal is "0", wherein said selecting step further comprises selecting, when the overflow-bit for the second digital signal changes from "0" to "1", the first digital signal, and retaining the selection of the first digital signal when the overflow-bit for the second digital signal changes from "1" to "0" if the state of "0" changes to "1" within a preset time.

13. The analog-to-digital conversion apparatus as set forth in claim 6, further including:

selection information generation part for generating selection information representing the state of selection of the digital signal;

look-up tables in which scale correction data depending upon the level of an input signal are stored; and a scale correction part for correcting the selected digital signal to a digital signal corresponding to the magnitude of the level of the input signal with reference to one of the look-up tables depending upon the selection information.

* * * * *